US012607171B2

(12) United States Patent
Oh et al.

(10) Patent No.: US 12,607,171 B2
(45) Date of Patent: Apr. 21, 2026

(54) SELF-TRANSFORMABLE ACTUATOR AND DISPLAY DEVICE USING SAME

(71) Applicant: LG ELECTRONICS INC., Seoul (KR)

(72) Inventors: Jaewon Oh, Seoul (KR); Sangsoo Lee, Seoul (KR); Haknyun Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 833 days.

(21) Appl. No.: 17/763,911

(22) PCT Filed: Apr. 9, 2020

(86) PCT No.: PCT/KR2020/004838
§ 371 (c)(1),
(2) Date: Mar. 25, 2022

(87) PCT Pub. No.: WO2021/060639
PCT Pub. Date: Apr. 1, 2021

(65) Prior Publication Data
US 2022/0316460 A1     Oct. 6, 2022

(30) Foreign Application Priority Data
Sep. 27, 2019     (KR) ........................ 10-2019-0120020

(51) Int. Cl.
*F03G 7/06*     (2006.01)
*G06F 1/16*     (2006.01)
*G09F 9/30*     (2006.01)
*H02N 10/00*     (2006.01)
(Continued)

(52) U.S. Cl.
CPC ......... *F03G 7/0614* (2021.08); *G06F 1/1616* (2013.01); *G09F 9/301* (2013.01); *H02N 10/00* (2013.01); *H10K 77/111* (2023.02); *H10K 2102/311* (2023.02)

(58) Field of Classification Search
CPC .............. H10K 77/111; H10K 2102/31; F03G 7/0614; G06F 1/1616; G06F 1/1652; G09F 9/301; H02N 10/00; H04M 1/0268
See application file for complete search history.

(56) References Cited

U.S. PATENT DOCUMENTS

2017/0367198 A1* 12/2017 Park ........................ H10K 50/84
2018/0011510 A1* 1/2018 Choi ................... G06F 11/3089
2018/0267574 A1 9/2018 Cho et al.

FOREIGN PATENT DOCUMENTS

CN          109960317 A      7/2019
JP          2002-73252 A     3/2002
JP          2003-280546 A    10/2003
(Continued)

*Primary Examiner* — Brook Kebede
(74) *Attorney, Agent, or Firm* — Birch, Stewart, Kolasch & Birch, LLP

(57)          ABSTRACT

An actuator according to one aspect of the present invention includes a first member in which a shape is transformed from a first position, which is either rolled or flat, to a second position different from the first position, and a restoring force is stored when the shape is transformed from the first position to the second position, and a second member which is joined to the first member along the length direction of the first member and in which the shape of the second position is stored.

16 Claims, 19 Drawing Sheets

(51) Int. Cl.
　　H10K 77/10　　　　(2023.01)
　　*H10K 102/00*　　　　(2023.01)

(56)　　　　　　　　References Cited

FOREIGN PATENT DOCUMENTS

| KR | 10-2013-0113898 | A | 10/2013 |
|---|---|---|---|
| KR | 10-1404628 | B1 | 6/2014 |
| KR | 10-2015-0018730 | A | 2/2015 |
| KR | 10-1785444 | B1 | 11/2017 |
| KR | 10-1970306 | B1 | 4/2019 |

* cited by examiner

[FIG. 1]
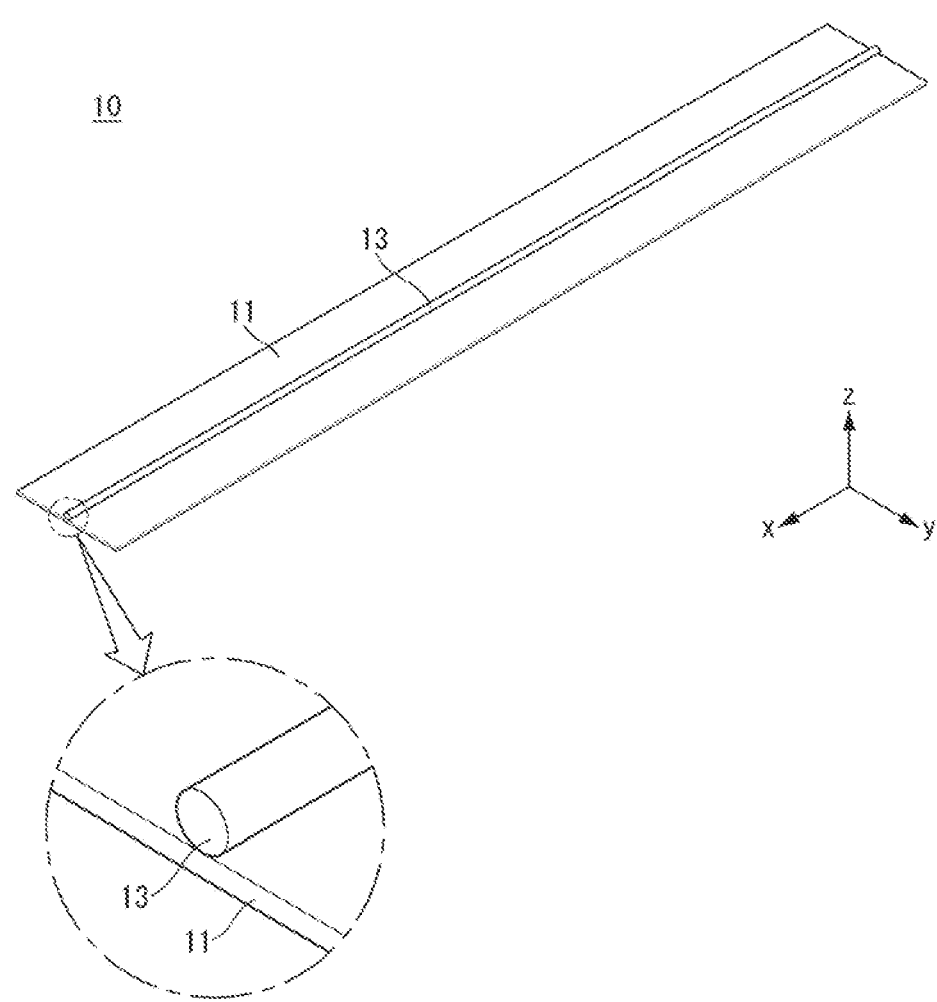

[FIG. 2]
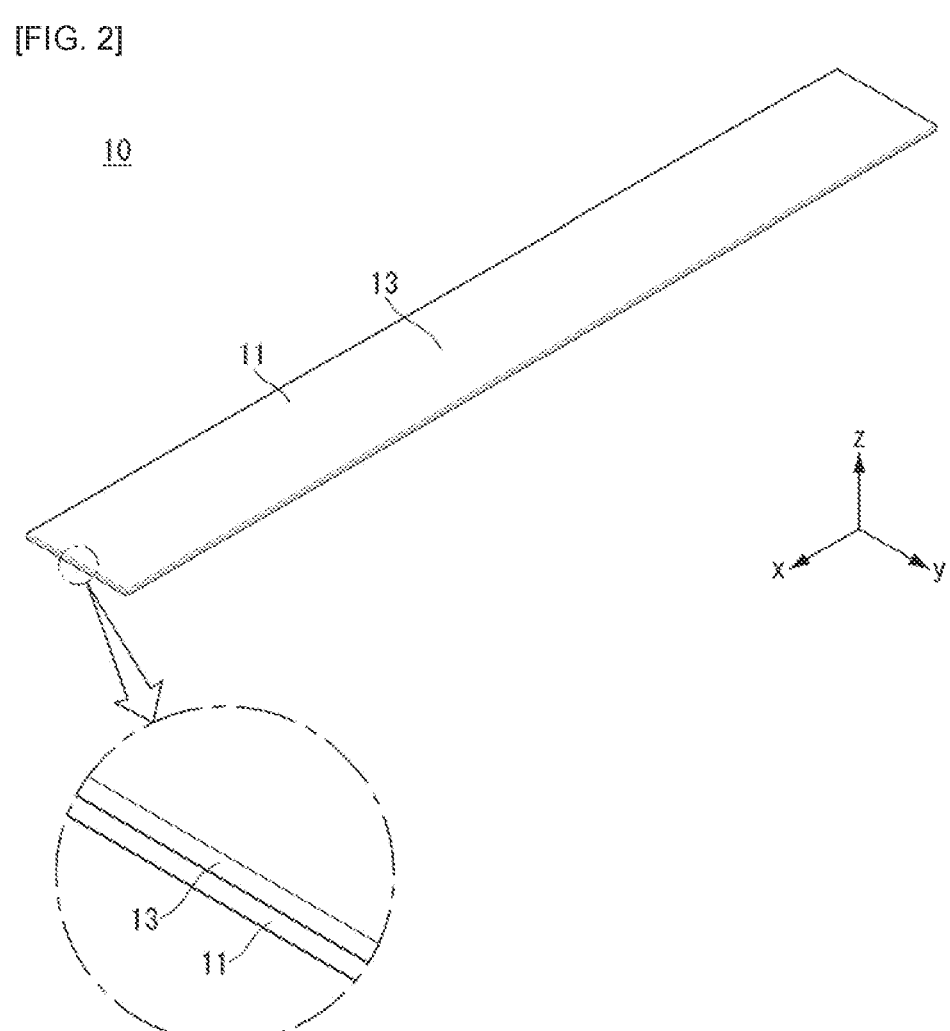

[FIG. 3]
(FIRST POSITION)
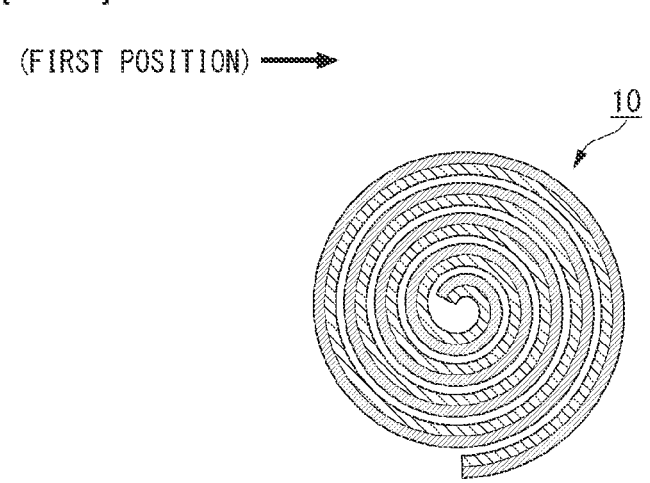
(SECOND POSITION)
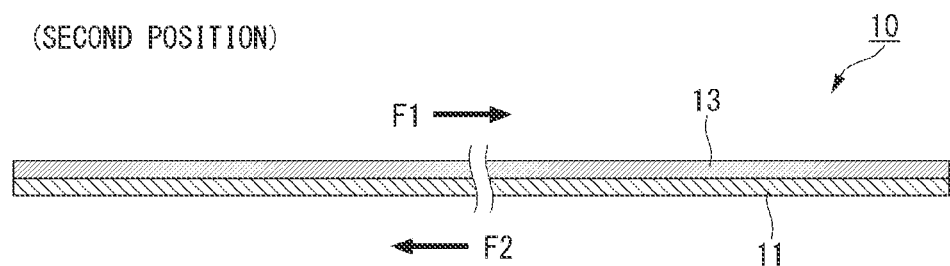
(THIRD POSITION)
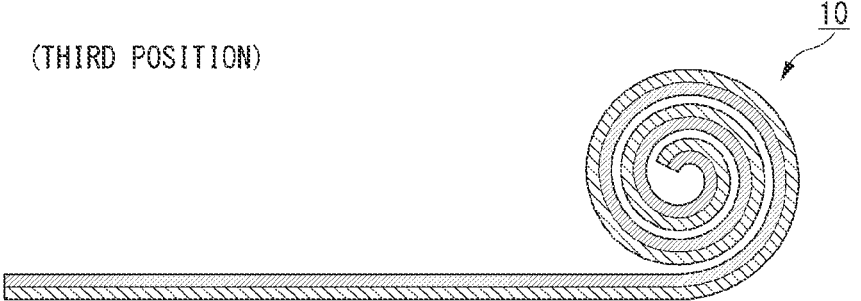

[FIG. 4]
(A)
RESTORING FORCE ━━━▶                                        11
(B)
11
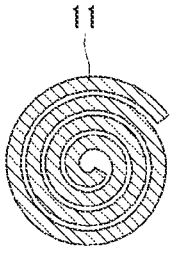
◀━━━ EXTERNAL FORCE
[FIG. 5]
(A)
13
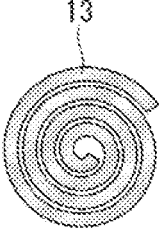
(B)
13

[FIG. 6]
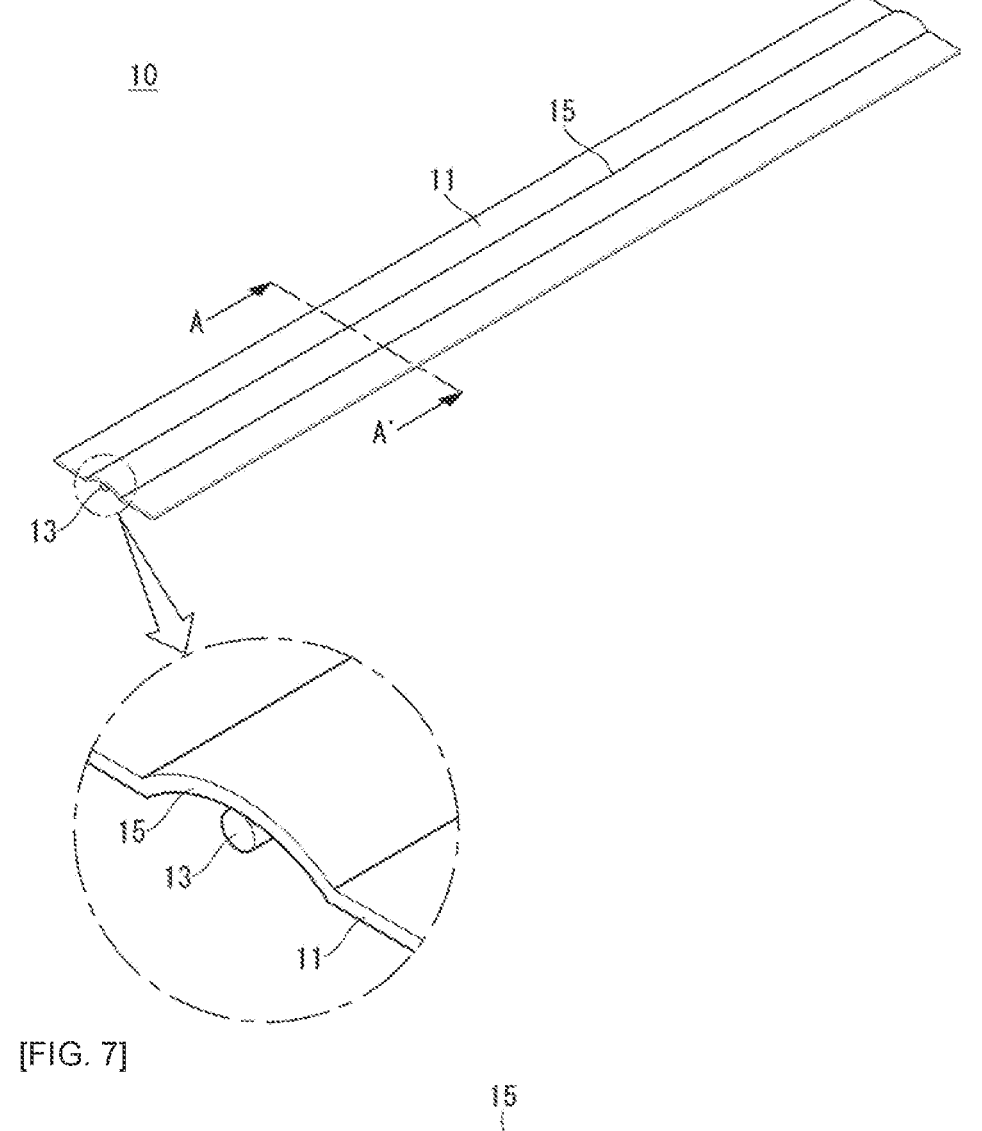
[FIG. 7]
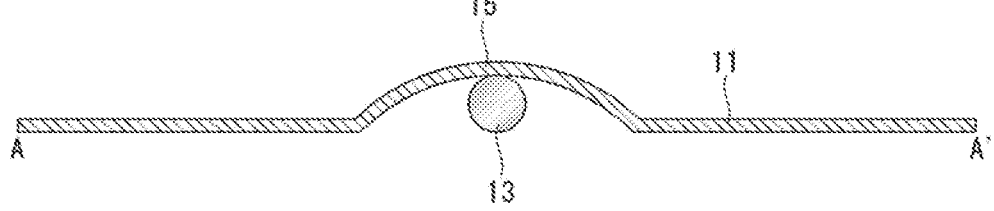

[FIG. 8]
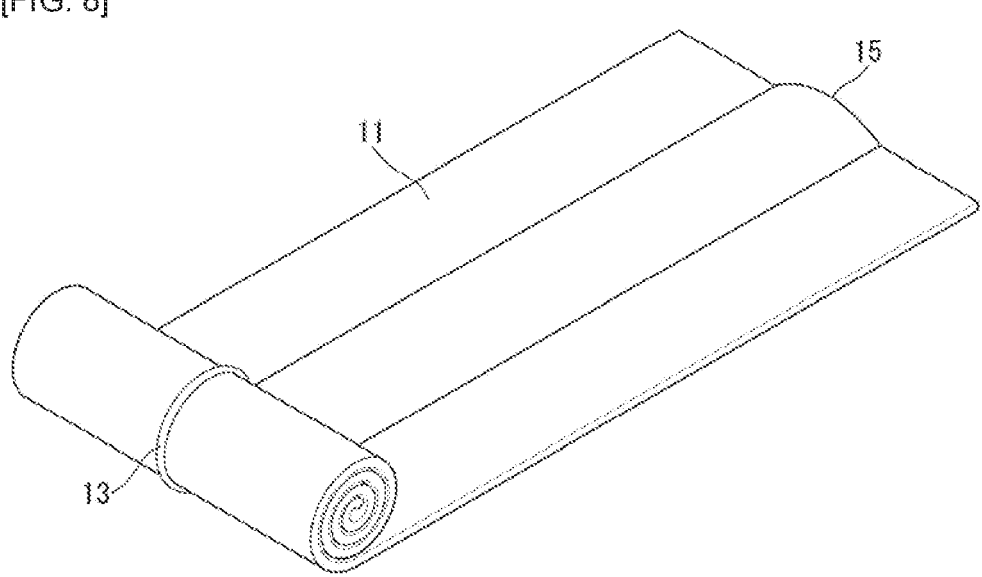
[FIG. 9]
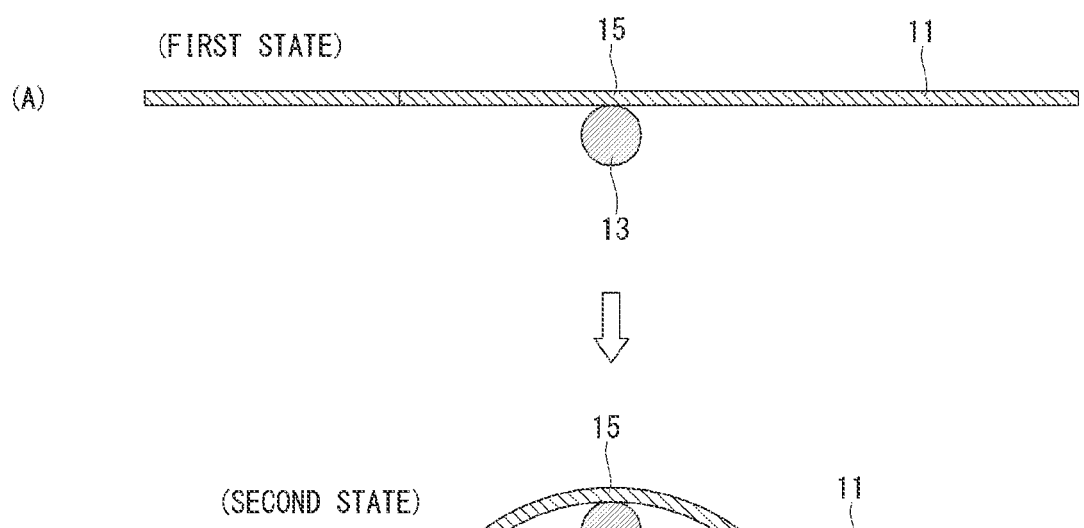

[FIG. 10]
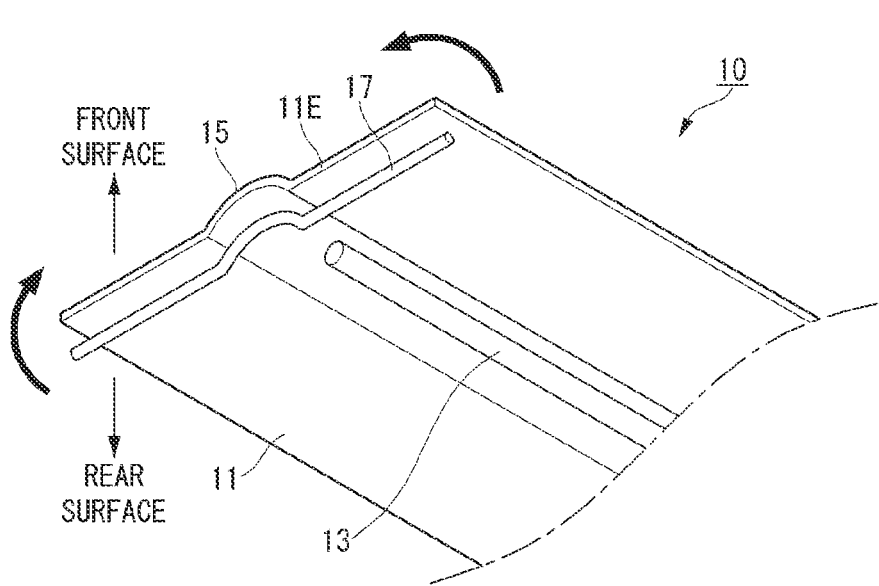

[FIG. 11]

[FIG. 12]
<u>10</u>
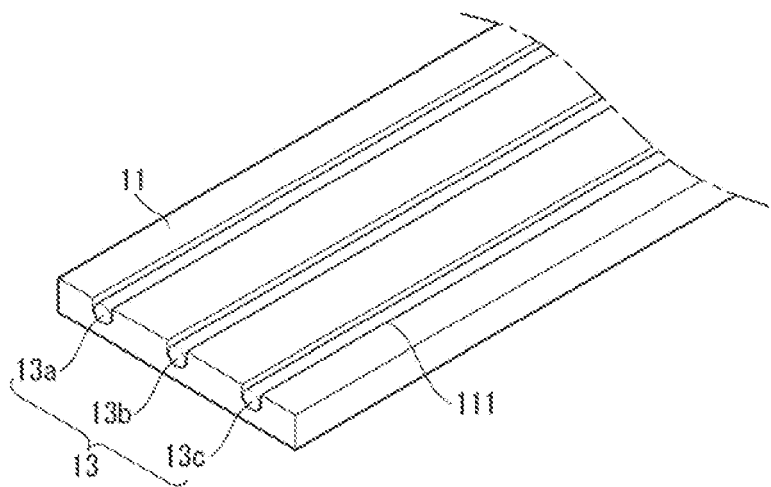

[FIG. 13]
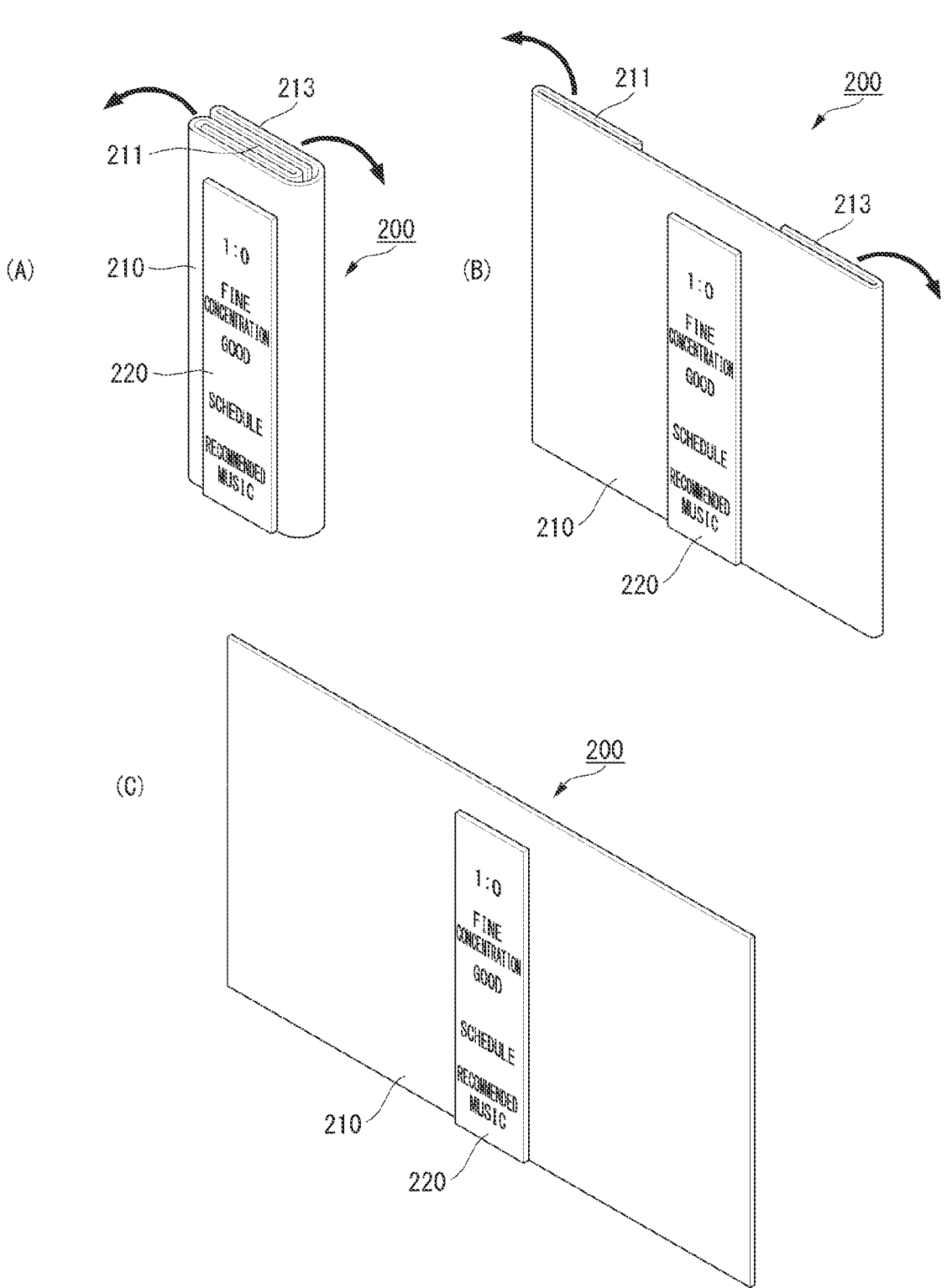

[FIG. 14]
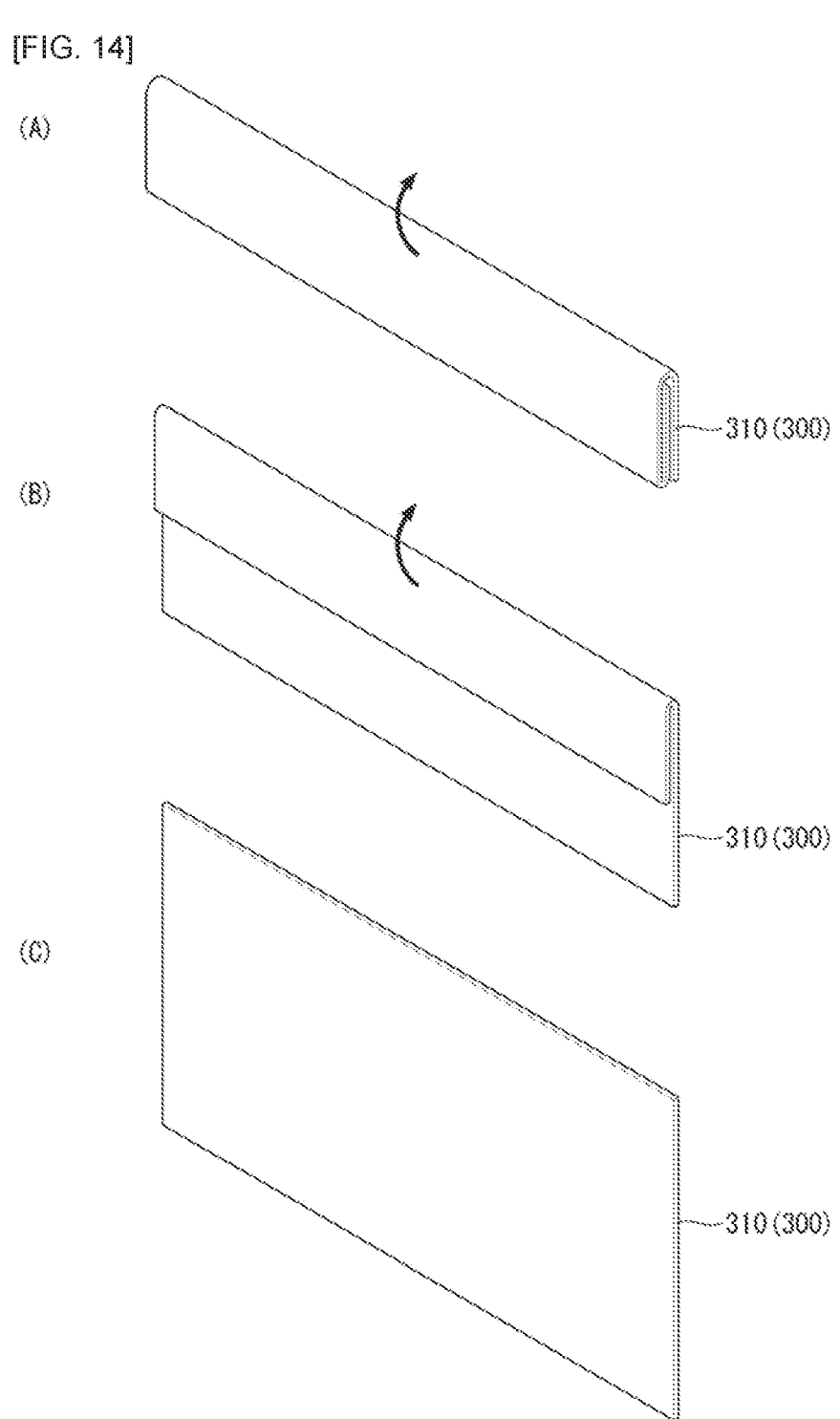
(A)
310 (300)
(B)
310 (300)
(C)
310 (300)

[FIG. 15]
(A)
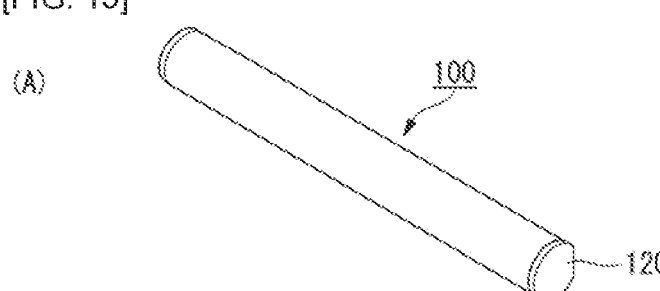
(B)
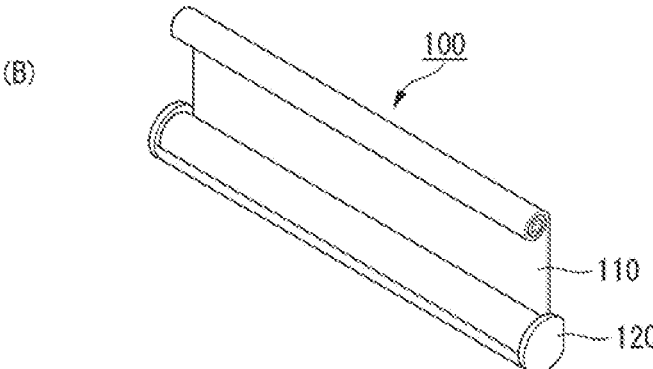
(C)
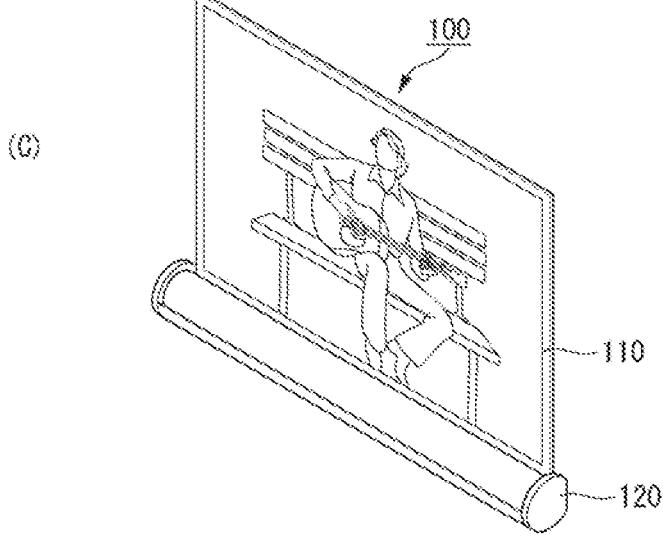

[FIG. 16]
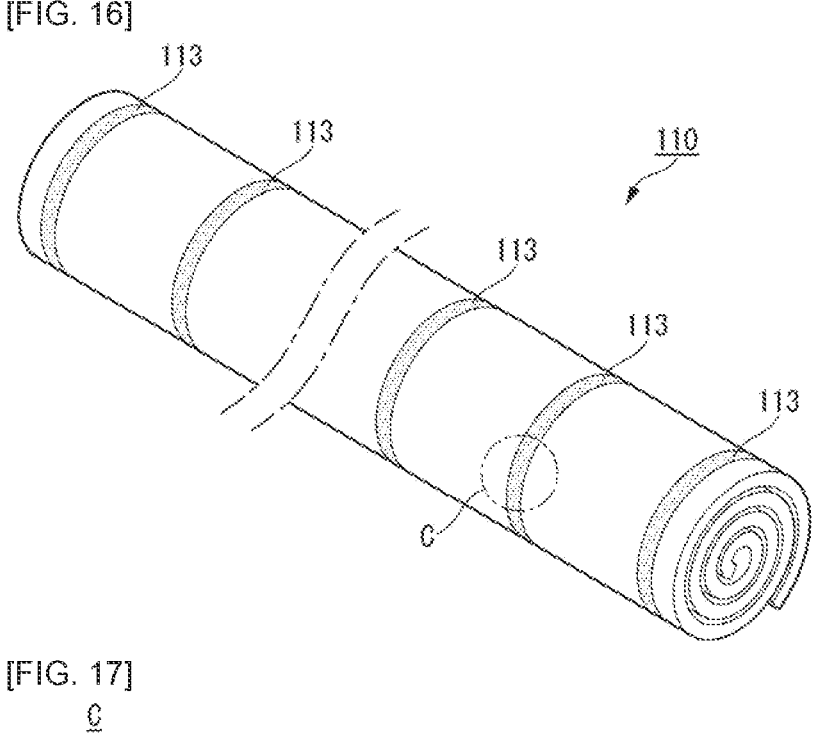
[FIG. 17]
C
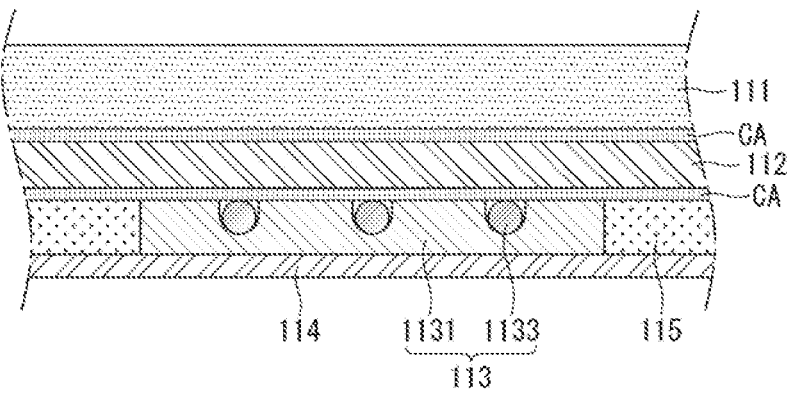

[FIG. 18]
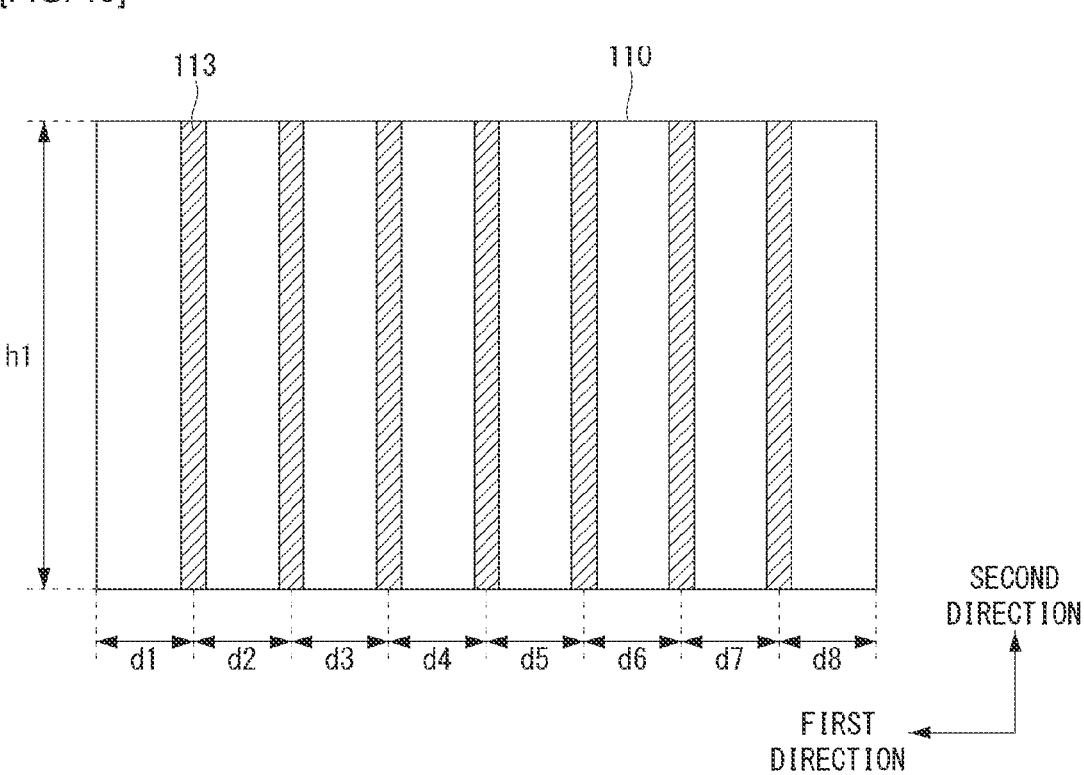

[FIG. 19]

```
 110    1131        1133              130              140
  │       │           │                │                │
┌─────────────────────────────┐  ┌──────────┐    ┌──────────┐
│ ┌─────────┐ ┌─────────┐     │  │          │    │          │
│ │  FIRST  │ │ SECOND  │     │──│ SWITCHING│────│ CONTROL  │
│ │ MEMBER  │ │ MEMBER  │     │  │   UNIT   │    │   UNIT   │
│ └─────────┘ └─────────┘     │  │          │    │          │
└─────────────────────────────┘  └──────────┘    └──────────┘
                                       │                │
                                  ┌────────────┐
                                  │POWER SUPPLY│
                                  │    UNIT    │
                                  └────────────┘
                                        │
                                       150
```

[FIG. 20]

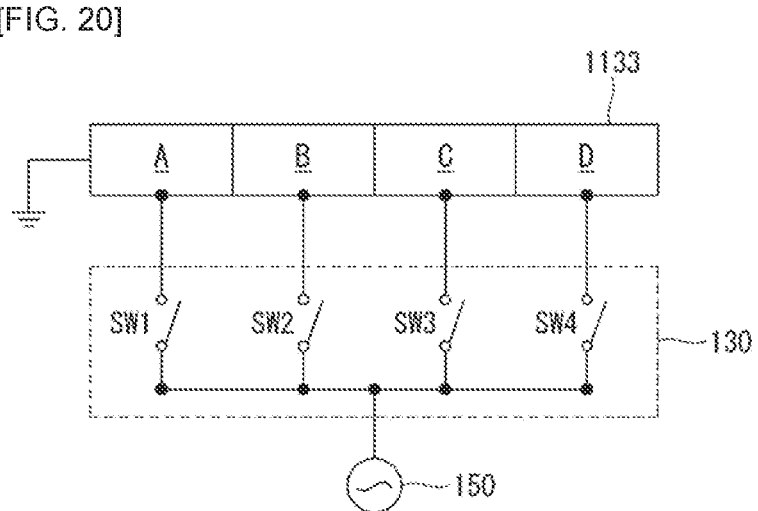

[FIG. 21]
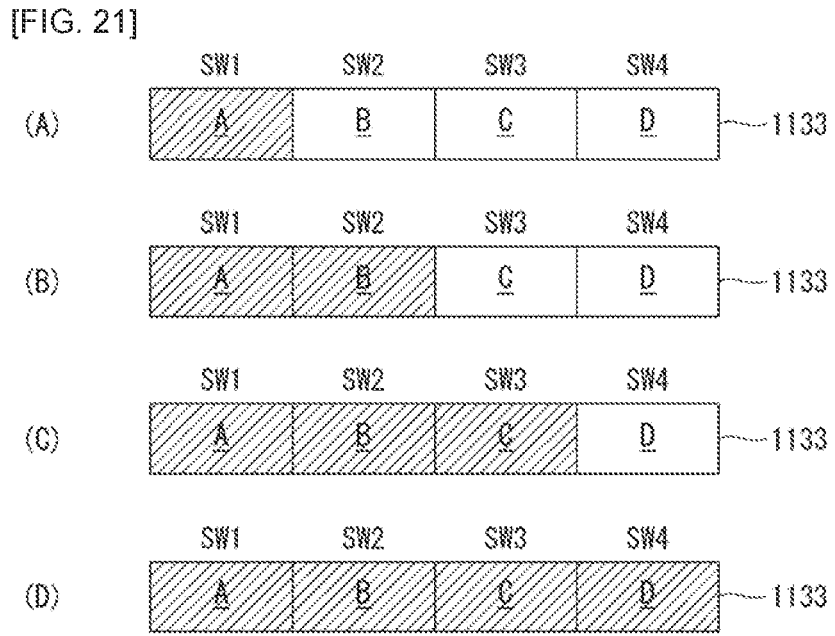

[FIG. 22]
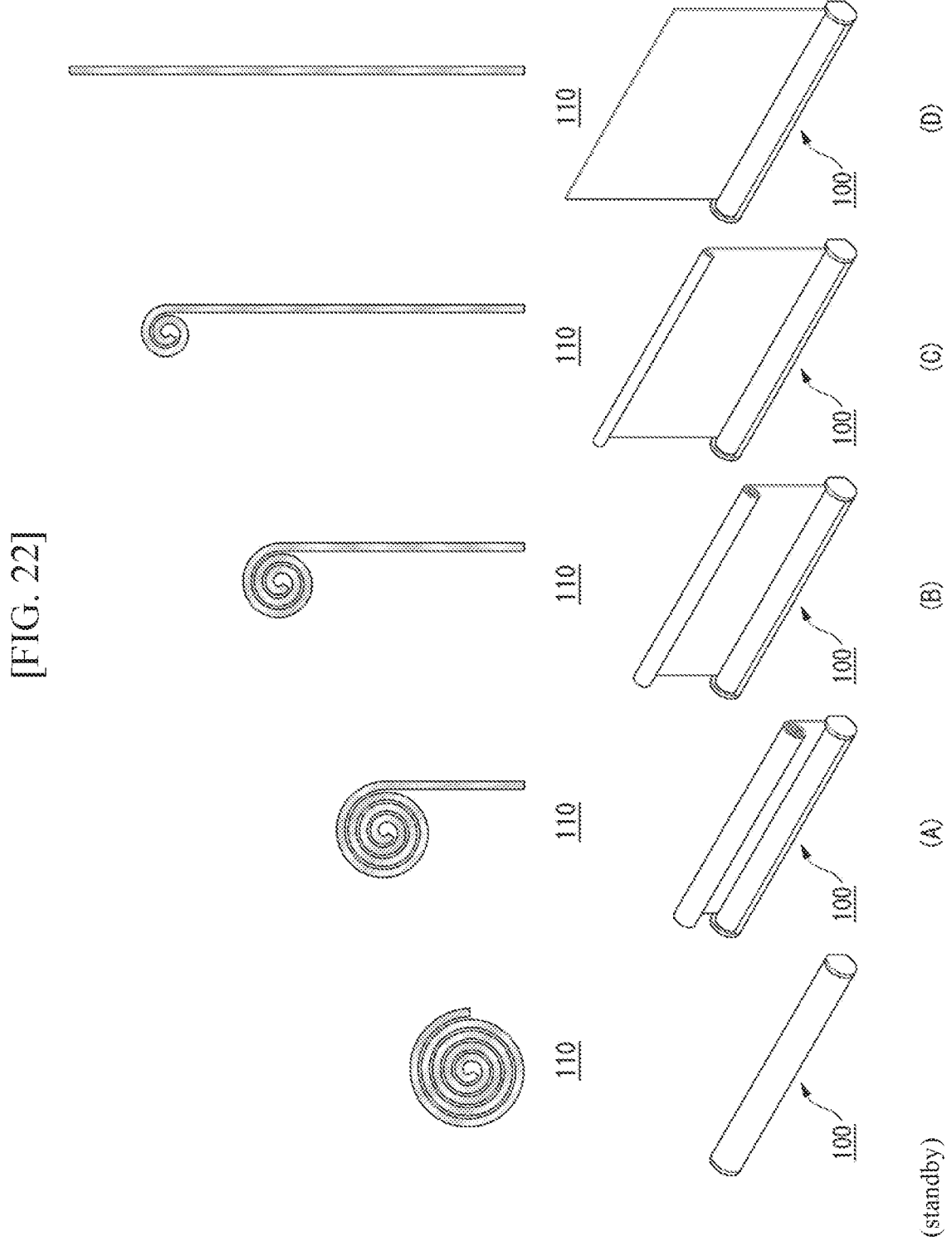

[FIG. 23]
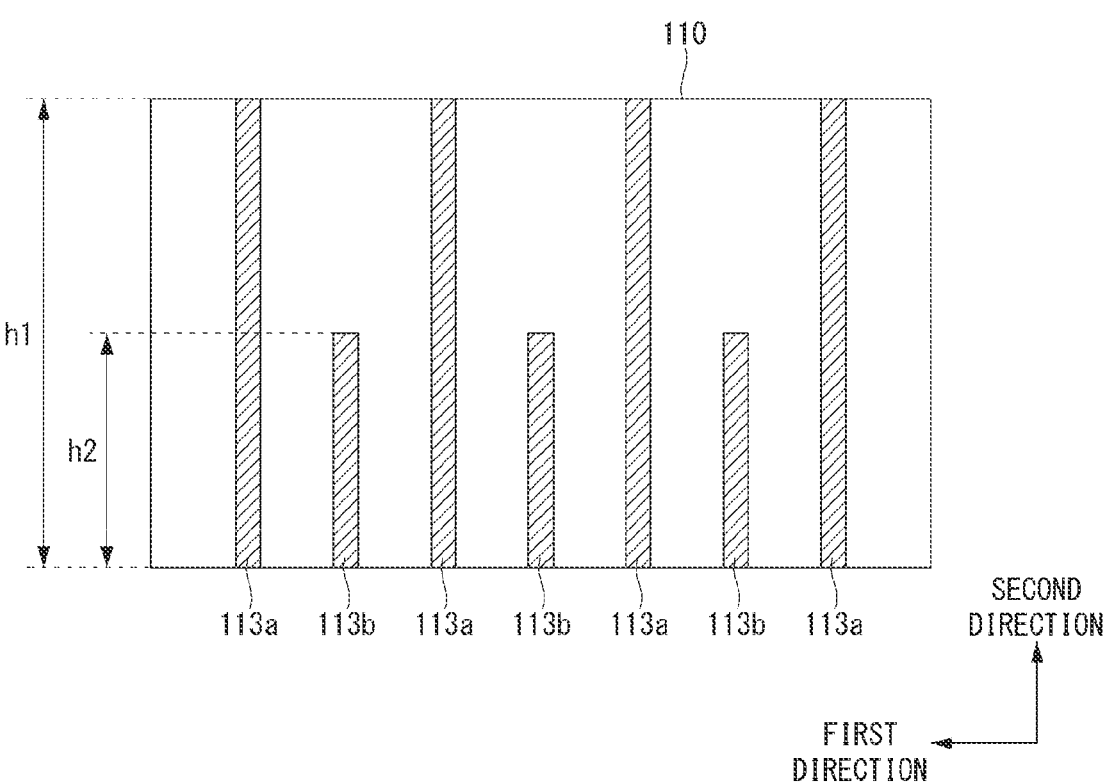

[FIG. 24]
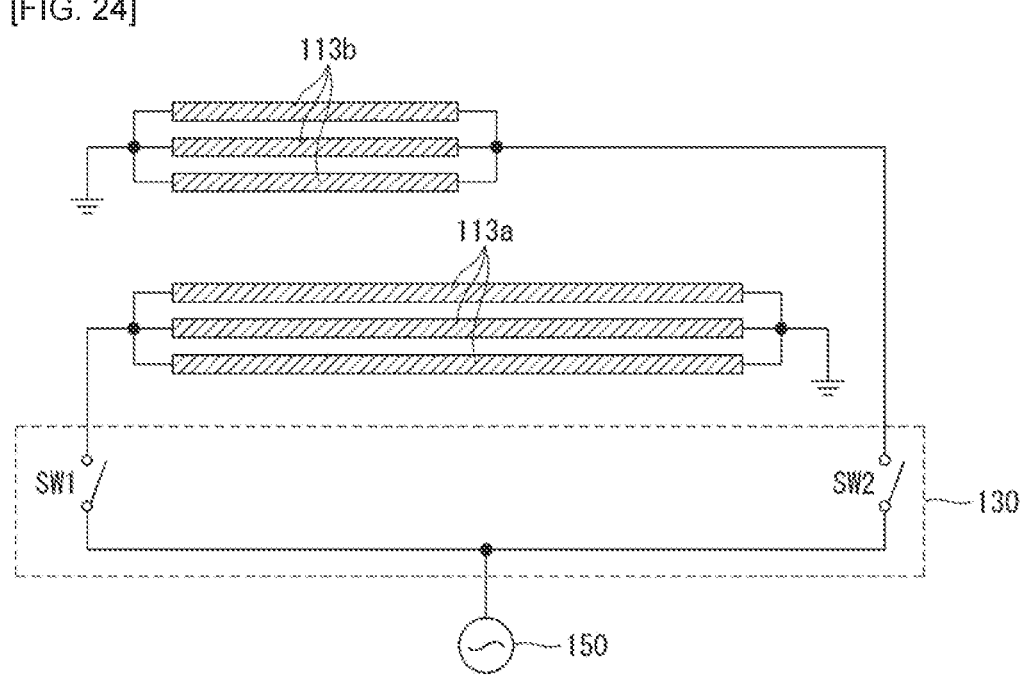

SELF-TRANSFORMABLE ACTUATOR AND DISPLAY DEVICE USING SAME

CROSS REFERENCE TO RELATED APPLICATIONS

This application is the National Stage filing under 35 U.S.C. 371 of International Application No. PCT/KR2020/004838, filed on Apr. 9, 2020, which claims priority to Korean Patent Application No. 10-2019-0120020 filed on Sep. 27, 2019, the entire contents of all these applications hereby expressly incorporated by reference into the present application.

TECHNICAL FIELD

The present disclosure relates to a wireless communication system and, more particularly, to a method of transmitting a V2X message and an apparatus supporting the same.

BACKGROUND ART

With the development of an information society, a demand for a display device increases in various forms, and according to the demand, in recent years, various display devices including a liquid crystal display device (LCD), a plasma display panel (PDP), an electro luminescent display (ELD), a vacuum fluorescent display (VFD), etc., have been researched and used.

Among them, the display device using the organic light emitting diode (OLED) has an advantage of being excellent in terms of luminance characteristics and viewing angle characteristics, ultra-thin because a backlight unit is not required, and implemented by a display which is foldable or rollable as compared with the liquid crystal display device (LCD).

Such a flexible display can be applied and used in various fields, and as an example, electronic companies showed a rollable or foldable TV employing the flexible display on a television.

Meanwhile, even though the flexible display is foldable or rollable, the flexible display is rollable or unrollable only by applying force externally, but self-transformation of the display is impossible. Therefore, when the flexible display is implemented by an electronic product, a complicated and heavy machine device is required, which mechanically folds or rolls the display. Therefore, a display device having a rollable or folding type screen, which is implemented up to now cannot but be large in volume, and heavy.

DISCLOSURE

Technical Problem

An object of the present disclosure is to solve the problems and other problems.

An object of the present disclosure is to provide a bidirectional self-transformable actuator which is rolled or unrolled, or on the contrary, unrolled or rolled.

Another object of the present disclosure is to provide a display device configured to include a bidirectional self-transformable actuator.

Technical Solution

In order to achieve the above-described object, a self-transformable actuator according to one aspect of the present disclosure includes: a first member having a shape which is transformed from a first position which is any one of a rolled state or an unrolled state to a second position different from the first position and storing restoring force when the shape is transformed from the first position to the second position; and a second member bonded to the first member in a longitudinal direction of the first member, and storing the shape of the second position.

The first member may be an elastic body and the second member may be a shape memory alloy.

The first member and the second member may have a rolled shape at the first position.

The second member may further include a stopper which maintains the second position.

The stopper may be constituted by a part of the first member, and may have a length which is equal to a length of the first member in the longitudinal direction of the first member.

The stopper may allow at least a part of a cross section of the first member to be projected in a rounded state at the second position, and the cross section of the first member to act to be flat at the first position.

The self-transformable actuator may further include a trigger disposed on one end of the first member and storing a shape opposite to the shape stored by the second member.

In another aspect of the present disclosure, a rollable display device may include: a rollable display panel; a self-transformable actuator including first members arranged on a rear surface of the rollable display panel lengthy in a first direction in line with contiguous members, and having a shape transformed from a first position which is any one of a rolled state or an unrolled state to a second position different from the first position, and storing restoring force when the shape is transformed from the first position to the second position, and a second member bonded to the first member in a longitudinal direction of the first member, and storing the shape of the second position; a power supply unit supplying power to the second member; and a switching unit of which one end is connected to the second member of the actuator and the other end is connected to the power supply unit, in which the switching unit may selectively control the power supplied from the power supply unit to the second member, and the rollable display panel may operate to be rolled or unrolled stepwise.

The actuator may include a plurality of actuators having the same length spaced apart from contiguous actuators by a predetermined interval, the second member may include first to an an-th area split into n areas, the switching unit may operate to sequentially supply the power from the first area to the n-th area when the rollable display panel is transformed from the first position to the second position, and an area of the second member to which the power is supplied may be sequentially accumulated.

The first area may be an area corresponding to an outermost portion when the rollable display panel is rolled, and the n-th area may be an area disposed at an innermost portion.

The actuator may include a plurality of actuators spaced apart from contiguous actuators by a predetermined interval, the plurality of actuators may at least include first and second actuators having different lengths, and the switching unit may supply the power only to any one of the first or second actuator.

The rollable display device may further include an interplate disposed between the rollable display panel and the actuator, and absorbing a shock.

Advantageous Effects

Effects of a display device according to the present disclosure will be described below.

According to at least one of the embodiments of the present disclosure, since an actuator is made of a shape memory alloy storing an unrolled shape, the actuator is transformable in an unrolling direction when an electric signal is applied to the actuator, and further, since the actuator stores restoring force when being unrolled, rolling-direction transformation is also possible by the restoration, and as a result, it is possible to transform the shape of the actuator in both directions.

Further, since an actuator according to an embodiment is shape-transformable in both directions by an electric signal, the display can be rolled or unrolled in a rollable display without a help of a machine device, thereby significantly reducing a weight and a volume of the device.

An additional range of an applicability of the present disclosure will be apparent from the following detailed description. However, since various changes and modifications can be clearly appreciated by those skilled in the art within the spirit and the scope of the present disclosure, the detailed description and a specific embodiment such as a preferred embodiment of the present disclosure should be appreciated as being just given as an example.

DESCRIPTION OF DRAWINGS

FIGS. 1 and 2 are diagrams each illustrating an entire shape of an actuator according to an example.

FIG. 3 is a diagram illustrating an operation state of the actuator.

FIG. 4 is a diagram for describing an operation state of a first member.

FIG. 5 is a diagram for describing the operation state of a second member.

FIG. 6 is a diagram illustrating an actuator according to an embodiment, which is configured to further include a stopper.

FIG. 7 is a diagram illustrating a cross-sectional shape taken along line A-A' of FIG. 6.

FIGS. 8 and 9 are diagrams for describing an operation of the stopper.

FIG. 10 is a diagram illustrating a rear surface of the actuator configured to further include a trigger.

FIG. 11 is a diagram illustrating a cross-sectional shape of other examples of the actuator.

FIG. 12 is a diagram illustrating the actuator according to FIG. 11(E).

FIG. 13 is a diagram illustrating an operation of a display device according to a horizontal folding scheme.

FIG. 14 is a diagram illustrating the operation of the display device according to a vertical folding scheme.

FIG. 15 is a diagram illustrating an operation state of a display device of a rollable scheme.

FIG. 16 is a diagram illustrating a display unit of the display device illustrated in FIG. 15.

FIG. 17 is a diagram illustrating a partial cross-sectional shape for part "C" of FIG. 16.

FIG. 18 is a diagram illustrating a shape in which the actuator is disposed in the display unit.

FIG. 19 is a diagram illustrating a functional block of a rollable display device according to an embodiment of the present disclosure.

FIG. 20 is a diagram illustrating a detailed configuration of a switching unit.

FIGS. 21 and 22 are diagrams schematically illustrating how the display unit operates stepwise by an operation of the switching unit.

FIG. 23 is a diagram illustrating an arrangement shape of first and second actuators having different lengths.

FIG. 24 is a diagram illustrating a configuration of the switching unit that operates the actuator illustrated in FIG. 23.

MODE FOR DISCLOSURE

Hereinafter, embodiments disclosed in the present disclosure will be described in detail with reference to the accompanying drawings and the same or similar components are denoted by the same reference numerals regardless of a sign of the drawing, and duplicated description thereof will be omitted. Suffixes "module" and "unit" for components used in the following description are given or mixed in consideration of easy preparation of the present disclosure only and do not have their own distinguished meanings or roles. Further, in describing the embodiment of the present disclosure, a detailed description of related known technologies will be omitted if it is determined that the detailed description makes the gist of the embodiment disclosed in the present disclosure unclear. Further, it is to be understood that the accompanying drawings are just used for easily understanding the embodiments disclosed in the present disclosure and a technical spirit disclosed in the present disclosure is not limited by the accompanying drawings and all changes, equivalents, or substitutes included in the spirit and the technical scope of the present disclosure are included.

In addition, in the drawings, for a simplified illustration according to selection, the components of each part may be expressed slightly differently according to the drawings, but the same reference numerals represent the same components.

Hereinafter, an organic light emitting display (OLED) in which a display panel is rolled is described as an example, but the present disclosure is not intended to be limited thereto. In addition to the OLED, various types of other displays which are rolled may also be used as the display panel.

In the present disclosure, bidirectional self-transformation refers to being transformed by self-force without a help of another separate machine device in each of first-direction transformation of being rolled and unrolled and second-direction transformation of being unrolled and rolled opposite thereto.

Hereinafter, an actuator according to an embodiment of the present disclosure will be described with reference to FIGS. 1 to 3. FIGS. 1 and 2 are diagrams each illustrating an entire shape of an actuator according to an example, and FIG. 3 is a diagram illustrating an operation state of the actuator.

Referring to the diagrams, an actuator 10 according to an embodiment may be shape-transformed so as to be self-transformed in both directions. The actuator 10 may be shape-transformed from a first position which is any one of a rolled state or an unrolled state to a second position different from the first position, i.e., being unrolled or rolled. In an example, the first position may be a rolled state and the second position may be an unrolled state. Further, the actuator 10 according to an embodiment may also be in a third state which is a state in which a part is unrolled and another part is rolled, which is an intermediate state of the first position and the second position.

For the actuator 10, the first-direction transformation of being rolled and unrolled and the second-direction transformation opposite thereto may be made by the self-force without the help of the separate machine device. To this end, when the actuator 10 is transformed in a first direction, the actuator 10 may store restoring force so as to be elastically restored, and may be transformed in a second direction by restoring force stored in the first position.

The actuator 10 may form the first position before an electric signal is input from the outside, and form a second or third state as the electric signal is input. In this case, the actuator 10 may store the restoring force when being changed from the first position to the second position or from the first position to the state of being unrolled from the rolled state of the shape like the third state, and may be shape-transformed by using the stored restoring force when being shape-transformed from the unrolled state to the rolled state.

The actuator 10 according to an embodiment may be configured to have a long thin band (or bar) shape in one direction (an x-axis direction in the diagram). When the actuator 10 has the thin band shape, if the device is implemented by applying the actuator to the display, there is an effect that a volume of the device is reduced and further, there is an advantage that the actuator may be easily installed in and applied to the display.

The actuator 10 according to an embodiment may be configured to include a first member 11 and a second member 13. When the actuator 10 is in the second position, the first member 11 stores one-direction restoring force F1 and restoring force F2 which acts in an opposite direction to the restoring force F1 acts on the second member 13. Accordingly, when the restoring force F2 disappears, the actuator 10 may be shape-restored from the second position to the first position through the stored restoring force F1.

When the first member 11 is shape-transformed from the first position to the second position, the restoring force may be generated. In an example, the restoring force may be elastic force.

If the force is not applied to the first member 11 from the outside, the first member may maintain the first position and when if the force is applied to the first member 11 from the outside, the first member 11 may be unrolled in the first direction and have a bar shape.

The first member 11 which operates as such may be configured by a clockwork spring made of metal or non-metal or a resin product which is made of a resin such as polyurethane and molded in the rolled state, as an example.

In an example, the second member 13 may be configured to have a long thin band shape in one direction similarly to the first member 11 (FIG. 2) or configured to have a long wire shape in one direction.

In an example, the second member 13 may be made of a shape memory alloy storing the shape, and in this case, the second member 13 preferably has the wire shape. When heat is given to the shape memory alloy, the shape memory alloy has a characteristic of being returned to the stored shape. However, when the second member 13 has the thin band shape, there is an advantage that temperature control is easy.

The second member 13 may be joined on any one surface of the first member 11 lengthily in a longitudinal direction of the first member. As an example, when the second member 13 is formed lengthily in one direction, the first member 11 may also be formed lengthily in one direction similarly to the second member 13, and may be configured to be joined to any one surface of a front surface and a rear surface of the first member 11.

The second member 13 may be joined to the first member 11 through various known methods. As an example, the second member 13 may be joined to the first member 11 through mechanical joining such as an adhesive, welding, soldering, or pressing.

FIG. 4 is a diagram for describing an operation state of the first member 11.

Referring to FIG. 4, the first member 11 may have the rolled state in the first position (the state in which the actuator is rolled) and the unrolled state in the second position (the state in which the actuator is unrolled).

The first member 11 is molded to any one state of the unrolled state or the rolled state when being molded, and made of a material having elasticity. Therefore, when the force is not applied to the first member 11 from the outside, the first member may maintain the unrolled shape or have the rolled shape. In the present disclosure, since it is described that the first position indicates the rolled state as an example, the first member 11 is molded in the rolled state when being molded. As a result, the first member 11 forms the first position before the force is applied from the outside.

If the force is not applied to the first member from the outside, i.e., if the first member maintains the rolled shape in an initial position as it is and external force is applied in one direction, the first member 11 is unrolled to form the band shape. In this case, since the first member 11 is configured by an elastic body, the restoration to return in an opposite direction to the external force, i.e., to the initial position is generated and stored.

Accordingly, when the external force applied to the first member 11 disappears, the first member 11 may return to an original shape by the restoring force.

FIG. 5 is a diagram for describing the operation state of the second member 13.

Referring to FIG. 5, the second member 13 may be made of the shape memory alloy storing the shape in an example. In an example, the second member 13 may be a shape memory alloy storing a shape in which the second member 13 is unrolled straightly. In this case, the second member 13 may have the rolled shape A before the heat is applied, i.e., in the initial position, and when the heat is applied, the second member 13 may be shape-transformed to a straight line shape which is a shape stored as in (B) and when the heat disappears the second member 13 may be shape-transformed to the initial position of the rolled shape as in (A).

Accordingly, since the actuator 10 according to an embodiment is configured to include the first member 11 molded as the first position (rolled shape) and the second member 13 shape-stored as the second position (unrolled shape), when the heat is transferred to the second member 13, the second member 13 is shape-transformed from the first position to the second position, and in this case, since the first member 11 is also shape-transformed to the second position, the actuator 10 may store the restoring force while being shape-transformed from the first position to the second position.

Further, if the heat is supplied to the second member 13, the actuator 10 may maintain the second position.

In addition, when the supply of the heat to the second member 13 is stopped, the actuator 10 may be shape-transformed to the rolled shape which is the initial position while being unrolled by the restoring force.

As such, the actuator 10 according to an embodiment is shape-transformable from the first position to the second position (the first-direction transformation) and from the second position to the first position (the second-direction transformation).

FIG. 6 is a diagram illustrating an actuator 10 according to an embodiment, which is configured to further include a stopper and FIG. 7 illustrates a cross-sectional shape taken along line A-A' of FIG. 6.

Referring to the diagrams, the actuator 10 may be configured to further include a stopper 15. In an example, the stopper 15 may be configured as a part of the first member 11 or also formed separately from the first member 11. In the diagrams, it is illustrated that the stopper 15 is configured as a part of the first member 11.

The stopper 15 generates self-supporting rigidity so that the actuator 10 may maintain the second position. Here, the self-supporting rigidity refers to mechanical rigidity which allows the actuator 10 to maintain a self-unrolled state in the first position, i.e., the rolled state.

The stopper 15 does not operate in the first position (or initial position), and may operate when the actuator 10 is transformed from the first position to the second position. The stopper 15 may be formed by bending a part of the first member 11 in the longitudinal direction. More accurately, when the first member 11 is in the second position, the stopper 15 may be formed by bending processing of a part of the first member 11 in the longitudinal direction of the first member 11. According to this, a cross section of the first member 11 has a different shape in each of the first position and the second position. In the first position, the cross section of the first member 11 forms a flat cross section, and the stopper 15 operates in the second position, and as a result, the cross section of the first member 11 has a shape in which at least a part protrudes upward. Here, a portion where at least a part of the first member 11 protrudes in the second position is the stopper 15. A direction in which the stopper 15 protrudes is a direction in which an inner surface protrudes when the actuator 10 is rolled.

Due to the stopper 15 which operates as such, in the first position, the cross section of the first member 11 forms a flat shape, and in the second position, the cross section of the first member 13 has a shape in which at least a part protrudes.

Preferably, in respect to the stopper 15, a protruded shape of the stopper 15 in the second position may be a rounded shape.

Further, at least a part or the entirety of the stopper 15 may protrude based on the cross section of the first member 11 in the second position. In the diagrams, the stopper 15 is illustrated as a shape in which a part of the first member 11 protrudes.

Further, the stopper 15 may be formed in the entirety of the first member 11 in the longitudinal direction of the first member 11, and may have a shape in which the stopper 15 is horizontally symmetric around a center of the cross section in the second position.

When the actuator 10 is configured to include the stopper 15 as such, the second member 13 is preferably disposed inside an inner side of the stopper 15. The actuator 10 may have the unrolled shape in the second position, and in this case, the stopper 15 may protrude from the first member 11. Therefore, the second member 13 may be hidden to the inside of the first member 11.

FIGS. 8 and 9 are diagrams for describing an operation of the stopper 15.

Referring to FIGS. 8 and 9, when the actuator 10 is transformed from the first position (or initial position) to the second position, the stopper 15 operates and protrudes to the outside of the actuator 10. More accurately, the stopper 15 has a shape in which a part of the first member 11 protrudes and is convex up. As the actuator 10 is unrolled, the stopper 15 also operates according to the unrolling of the actuator 10 and a protruded portion of the first member 11, i.e., a length of the stopper 15 also increases according to an unrolling length of the actuator.

In this case, since the first member 11 stores the restoring force in the second position as described above, the actuator 10 is to be transformed to the first position. If the heat is not continuously supplied to the second member 13 in the second position, the actuator 10 will be shape-transformed to the second position due to the restoring force.

However, as the actuator 10 is changed to the second position, the stopper 15 operates to generate resistance force opposite to the restoring force, and when the actuator 10 reaches a point (second position) where the resistance force is larger than the restoring force, the actuator 10 may maintain a shape in which the actuator is unrolled in the first position by itself.

When the actuator 10 is transformed form the second state to the first state, since the protruding direction of the stopper 15 is up, the stopper 15 is pressed while the actuator 10 is rolled. The stopper 15 is unrolled by pressed force, and transformation force which also successively unrolls a contiguous portion is generated in a process of unrolling the stopper 10, and the stopper 15 is gradually unrolled in the longitudinal direction of the actuator 10. Therefore, the actuator 10 may be transformed to the first position by the restoring force storing in the second position.

FIG. 10 is a diagram primarily illustrating a rear surface shape of the actuator configured to further include a trigger.

As illustrated in FIG. 10, the actuator 10 according to an embodiment is configured to include the stopper 15, and a shape memory unit 13 is disposed inside the stopper 15 in the longitudinal direction of the actuator.

In addition, the trigger 17 may be installed close to an end portion 11E on a rear surface of one end portion of the actuator 10, more accurately, a rear surface of the first member 11.

In an example, the trigger 17 may be made of the shape memory alloy similarly to the second member 13, but the stored shape is preferably opposite.

When the second member 13 stores the shape in which the second member 13 is unrolled straightly, the trigger 17 stores the rolled shape. Accordingly, when the heat is supplied to the trigger 17, the trigger 17 may be bent in an arrow direction.

Accordingly, when the trigger 17 is bent as such a corner of the end portion 11E of the first member 13 may also be bent in a direction in which the stopper 15 operates, i.e., toward the front surface.

Consequently, the bending of the corner of the end portion 11E of the first member 13 caused in the operation of the trigger 17 acts the stopper 15 to be unrolled. As a result, transformation force caused while the stopper 15 is unrolled is propagated in the longitudinal direction of the stopper 15 and acts the stopper 15 to be unrolled, and the actuator 10 may be transformed from the second position to the first position.

Figure 11:
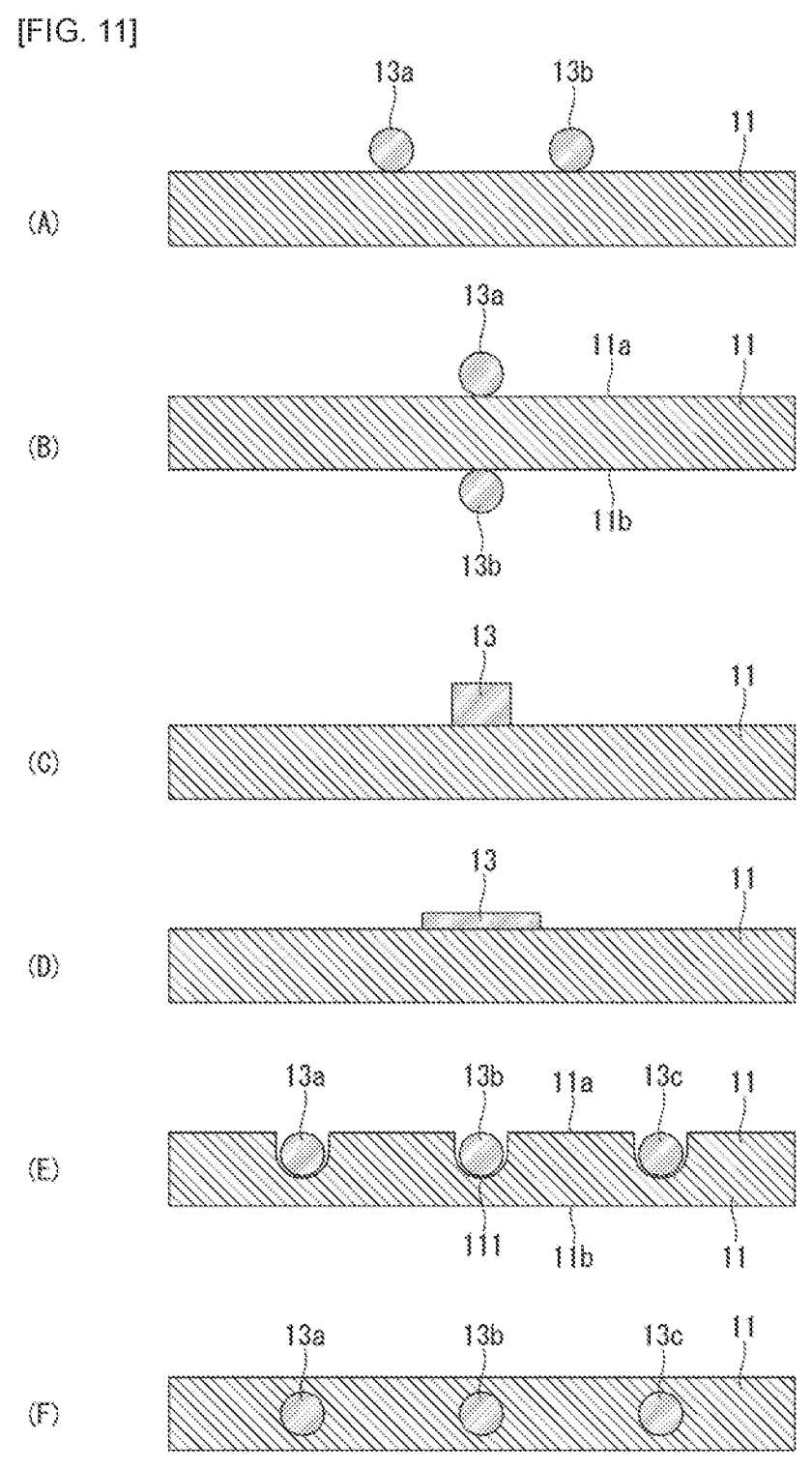

Meanwhile, the actuator may also be implemented even as various forms as illustrated in FIG. 11 in addition to the above-described form. Further, the actuator may also be implemented as various forms within a scope without departing from the technical spirit in addition to the embodiments described in the present disclosure, of course. FIG. 11 is a diagram illustrating a cross-sectional shape of other examples of the actuator.

Referring to FIG. 11, the actuator 10 may be configured to include a first member 11 having the band shape and two or more second members 13*a* and 13*b*. In this case, a first-second member 13*a* may be disposed on any one surface of the front surface and the rear surface of the first member 11 like a second-second member 13*b* in the longitudinal direction of the first member 11 (FIG. 11(A)).

As an example, as illustrated in the diagram, the second members 13*a* and 13*b* are configured to include the first-second member 13*a* and the second-second member 13*b* disposed adjacent to and in line with the first-second member 13*a*.

In this case, the respective second members 13*a* and 13*b* are preferably made of the same shape memory alloy so as to generate the same force, and further, it is preferable that the respective second members 13*a* and 13*b* also have the same cross-sectional size. Only when the respective second members have the same cross-sectional size, the respective second members are shape-transformed or when the respective second members return to the initial state, the same force may be generated in each of the first and second-second members 13*a* and 13*b*.

Alternatively, the first-second member 13*a* may be disposed on a front surface 11*a* of the first member 11 and the second-second member 13*b* may be disposed on a rear surface 11*b* of the first member 11 (FIG. 11(B)).

In this case (FIG. 11(B)), the first-second member 13*a* and the second-second member 13*b* may be made of the same shape memory alloy or different shape memory alloys. For example, when the actuator 10 is rolled to allow the front surface 11*a* of the first member 11 to face the inside, the first-second member 13*a* disposed on the front surface may be configured to have restoring force to return to the first state, which is smaller than or equal to the restoring force of the second-second member 13*b* disposed on the rear surface when being shape-transformed. When the actuator 10 is shape-transformed from the second state to the first state, since the second-second member 13*b* is positioned outside the first-second member 13*a*, if the restoring force of the second-second member 13*a* is larger than that of the first-second member 13*b*, since restoring force which acts on the outside is larger than restoring force which acts on the inside when the actuator 10 is rolled in the second state, the actuator 10 may be easily restored to the first state due to a difference between both restoring forces.

Further, the second member 13 constituting the actuator 10 may be configured to have a cross section having a square shape or a polygonal shape like a rectangular shape (FIGS. 11(C) and 11(D)).

In another form, the actuator 10 may also be implemented in a form in which the second member 13 is partially buried in the first member 11 or fully buried in the first member 11.

In FIG. 11(E), the first member 11 may be configured to include a plurality of grooves 111 on the front surface 11*a*. Meanwhile, an entire shape for the embodiment according to FIG. 11(E) is illustrated in FIG. 12.

Also referring to FIG. 12, a cross section of the groove 111 may have a shape similar to the cross-sectional shape of the second member 13. For example, if the cross section of the second member 13 has a rounded or angular shape, the cross section of the groove 111 may also have the round or angular shape.

The groove 11 may be formed lengthily in the longitudinal direction of the first member 11.

The second member 13 is positioned at the groove 111, and a part may protrude outside the first member 11 or may be joined to the first member 11 in a form of being positioned on the substantially same line as the surface.

Alternatively, the second member 13 may also be configured to be fully buried inside the first member 11.

In the case of the actuator according to an example illustrated in FIG. 11(F), the first member is preferably made of a resin composition molded in a first position shape.

Hereinafter, a display device configured to be folded or unfolded, which includes the actuator 10 configured as described above will be described. In an embodiment, the display may be driven in any one scheme of a rollable scheme in which the display is rolled or a folding scheme in which the display is folded.

FIG. 13 is a diagram illustrating an operation of a display device according to a folding scheme.

In FIG. 13, a display device 200 may be configured to include a display unit 210. Further, the display unit 210 may be folded, which includes the above-described actuator.

The display unit 210 may operate to include first to third modes A, B, and C according to the operation of the above-described actuator. In the example of FIG. 13, it is illustrated that the display unit 210 is folded two times, but the number of folding times may vary depending on the embodiment.

When the display unit 210 is fully unfolded, the display unit 210 may have the rectangular shape. When a first direction is a height and a second direction is a width, a length of the first direction may be larger than the length of the second direction.

Further, the display unit 210 may further include an auxiliary display unit 220. The auxiliary display unit 220 is driven separately from the display unit 210 to display various information, e.g., a current fine concentration, a scheme, a recommended music, a topic article, etc., to the user, thereby visually providing information.

In an example, the display unit 210 may be folded in a first direction, i.e., a horizontal direction or as illustrated in FIG. 14, the display unit 210 may be folded up and down.

In the first mode A, the display unit 210 is fully folded, and as a result, when the display unit is viewed from the front, the display unit 210 may have a rectangular shape in which the height is larger than the width.

The display unit 210 may include a folded first part 211 and a second part 213. The first part 211 is a part representing a left part of the display unit 210 is folded two times and the second part 213 is a part representing a right part of the display unit 210 is folded two times. The second part 213 may be positioned above the first part 213.

In the second mode B, each of the first part 211 and the second part 213 of the display unit 210 is partially unfolded, and as a result, a screen may be larger. In this case, the first part 211 and the second part 213 of the display unit 210 are partially folded.

In the third mode C, each of the first part 211 and the second part 213 of the display unit 210 is partially unfolded, and as a result, the screen may be larger.

According to the embodiment, the screen may be adjusted to be larger or smaller stepwise horizontally.

FIG. 14 illustrates a device in which a display unit 310 is vertically folded.

In a display device 300 according to the embodiment, the display unit 310 may be folded in a vertical direction, i.e., an elevation direction. In an embodiment, it is illustrated that the display unit 310 is folded two times similarly to the embodiment of FIG. 13.

The first mode A may be a state in which a power supply is turned off in the initial mode. In this case, the display unit 310 may be in a state of being fully folded, and in this case, the display unit 310 may be folded to have only a size of ⅓ of an original size.

In the second mode B, the display unit 310 may be in a state of being unfolded in an upper direction. Accordingly, the display unit 310 is in a state of being not fully unfolded and a part still is in a state of being folded.

In the second mode B, the size of the screen may be ⅔ of an original screen size.

The third mode C is a state in which the display unit 310 is fully unfolded.

According to the embodiment, the screen may be adjusted to be larger or smaller stepwise vertically.

FIG. 15 is a diagram illustrating an operation state of a display device of a rollable scheme. FIG. 16 is a diagram illustrating the display unit and FIG. 17 is a diagram illustrating a partial cross-sectional shape for part "C" of FIG. 16. In FIG. 15, a skin plate 114 disposed at an outermost portion of the display unit 110 is not illustrated to show an actuator 113 unlike FIG. 17.

Referring to the diagrams, the display device which operates in the rollable scheme according to an embodiment will be described in detail.

The display device 100 may be configured to include the display unit 110 and a housing 120.

The display unit 110 as a component that displays the image may be configured to include a display panel 111 and the actuator which rolls and unrolls the display panel or unrolls, and then rolls the display panel again.

The display panel 111 may be provided to the front surface of the display device 100 and may display the image. The display panel 111 divides the image into a plurality of pixels, and controls the image to be emitted according to a color, brightness, and a chroma for each pixel to output the image. The display panel 111 may be divided into an active area in which the image is displayed and an inactive area in which the image is not displayed.

The display panel 111 may have the rectangular shape. However, although not limited thereto, the display panel 111 may have a shape having a predetermined curvature on a corner. The display panel 111 may be an organic light emitting diode (OLED) panel which is rolled in one preferable form. However, the present disclosure is not limited thereto, and the display panel 111 may be implemented as various types of rolled flat-panel displays.

The actuator 113 may be provided on the rear surface of the display panel 111. The actuator 113 may be directly attached to the display panel 111, or an inter-plate 112 may be interposed between the actuator 113 and the display panel 111 and the actuator 113 may be joined to the inter-plate 112.

The inter-plate 112 may be formed with the same size as the display panel 10, and inserted to absorb an impact generated from the display panel 111. In an example, the inter-plate 112 may support the display panel 111, and further, the inter-plate 112 may be immediately attached to the rear surface of the display panel 111 by facing the display panel 111 face to face so as to stably roll the display panel 111. In one preferable form, when the inter-plate 112 is cured, the inter-plate 112 may be joined to the display panel 111 by an adhesive (CA) having a predetermined strength or more. Consequently, the display panel 111 and the inter-plate 112 may be implemented to constitute one assembly to operate as one body.

The actuator 113 may be provided to the rear surface of the inter-plate 112 and joined to the inter-plate 112 through various known methods. In the diagram, it is illustrated that the actuator 113 is joined by the adhesive (CA).

The actuator 113 is implemented as the actuator 10 described through FIGS. 1 to 12. In the diagram, a case where the actuator 113 is implemented as the embodiment illustrated in FIG. 12 is illustrated as one example.

The actuator 113 is transformed from a first position in which the display unit 110 is rolled to a second position in which the display unit 110 is unrolled or on the contrary, shape-transformed from the second position to the first position. An operation of the display unit 110 coupled to the actuator 113 will be described below in detail.

The housing 120 stores the display unit 110. In the display device proposed up to now, since the housing stores the display unit 110 and stores multiple machine devices for elevating the display unit 110, the device cannot but have a large volume and be heavy. However, in the present disclosure, since the actuator is self-transformed in both directions, the display unit 110 may be self-rolled or unrolled without a help of the machine device.

The display device 100 may operate in the first state A and the second state B. The first state A is a state before power is applied to the device while the display unit 110 is stored inside the housing 120. The second state C is a state in which the display unit 110 is fully unrolled to the outside of the housing 120.

When the display device 100 is in the first state A, the active area of the display unit 110, i.e., an area where the screen is displayed may be positioned inside the housing 120.

When the display device 100 does not operate or does not display the screen on the display, the display device 100 maintains the first state and when the display device 100 operates or displays the screen on the display, the display device 100 maintains the second state B.

Alternatively, the display device 100 may include the third state C which is an intermediate state between the first state A and the second state B. In the third state C, a part of the display device 100 is unrolled to the outside of the housing 120 or another part maintains the rolled state. The display unit 110 is unrolled or rolled according to the operation of the actuator 113. However, in the actuator 113, a rolled part is gradually unrolled while moving up and on the contrary, when the actuator 113 is rolled while being unrolled, the actuator 113 is rolled while moving down from an upper part to a lower part. Therefore, the display unit 110 may be rolled or unrolled by fixing the end portion of the display unit 110, and as a result, a heavy machine device such as a roller for rolling the display unit 110 is not required. The operation of the display unit 110 will be described below in detail.

As illustrated in FIG. 11, the display unit 110 is fully rolled in the first state (or initial state) which is the state in which the power is applied to the device. In this case, the display unit 110 is rolled so that the display panel 111 faces inward and the actuator 113 may be disposed behind the display unit 110.

FIG. 18 is a diagram illustrating a shape in which the actuator is disposed in the display unit. It is illustrated that the display unit 110 has a rectangular shape having a first-direction long axis and a second-direction short axis, and it is assumed that the display unit 110 is rolled and unrolled in the second direction.

In FIG. 18, a plurality of actuators may be provided on the rear surface of the display unit 110, more accurately, the rear surface of the display panel 111 or the rear surface of the inter-plate 112. The number of actuators 113 may be adjusted to an appropriate number by considering the size or the strength of the display unit 110 or transformation force of the actuator 113.

The actuator 113 having the thin band shape may be provided to the display unit 110 lengthily in the second direction, and a length h1 of the actuator 113 may be equal to the size of the display unit 110 in the second direction, i.e., the length of the short axis.

The plurality of actuators 113 is disposed to be separate from an actuator adjacent thereto in line in the first direction, and in this case, it is preferable that the actuator 113 is positioned so that all widths d1 to d8 of each area divided by the actuator 113 are equal to each other. According to such a layout, since all magnitudes of loads applied to the respective actuators 113 are equal to each other, the display unit 110 may be rolled or unrolled without crumpling.

FIG. 19 is a diagram illustrating a functional block of a display device according to an embodiment of the present disclosure.

The display device 100 according to an embodiment may be configured to include the display unit 110, the switching unit 130, the control unit 140, and the power supply unit 150.

The switching unit 130 is configured so that one end is connected to the display unit 110 and the other end is connected to the control unit 140, and the power supplied from the power supply unit 150 is controlled according to a control signal applied by the control unit to supply the power applied from the power supply unit 150 to the display unit 110, more accurately, a second member 1133 of the actuator 113. The actuator 113 includes a first member 1131 and the second member 1133. Here, the power may be any one of current or voltage.

A more detailed configuration for the switching unit 130 is illustrated in FIG. 20.

The switching unit 130 may be configured to include a plurality of switches sw1 to sw4. The number of switches may be changed according to the number of divided areas of the second member 1133 to which the power is supplied. In the diagram, it is illustrated that the second member 1133 is divided into four first to fourth areas A to D. It is regarded that all of the first to fourth areas A to D have the same dimension.

Here, the divided areas of the second member 1133 as a minimum unit that applies heat required for transforming the second member 1133 to a stored shape are configured to input the electric signal into the second member 1133 made of metal and generate the heat by electric resistance generated at that time in an embodiment.

Each of the switches sw1 to sw4 is configured so that one end of is connected to the power supply unit 150 and the other end is connected to each of the corresponding divided areas A to D of the second member 1133. In addition, the second member 1133 is commonly grounded.

Accordingly, the first switch sw1 may selectively supply the power supplied from the power supply unit 150 through a line to a first area A of the second member 1133 and the second to fourth switches sw2 to sw4 may also selectively supply the power to the corresponding second to fourth areas B to D, respectively.

FIGS. 21 and 22 are diagrams schematically illustrating how the display unit 110 operates stepwise by a selective operation of the switching unit.

Referring to the diagrams, the display device 100 is in a state in which the power is not supplied in a stand-by state, and all of the respective switches sw1 to sw4 maintain a turn-off state. Accordingly, the display unit 110 forms the fully rolled state while being stored in the housing.

Next, in Mode A, the first switch sw1 is turned on and the second to fourth switches sw2 to sw4 are turned off. As a result, the power supplied to the power supply unit 150 is selectively applied only to the first area A of the second member 1133 through the first switch sw1. Therefore, as the power is supplied to the first area A of the second member 1133, the heat is generated, and the first area A is transformed to the unrolled shape which is the stored shape. Accordingly, in Mode A, a part of the display unit 110 may be unrolled and another part may be rolled.

In an embodiment, the display unit 110 may be controlled to be unrolled sequentially from the outermost portion. That is, the first area A of the second member 1133 to which the power is applied in Mode A may be an area corresponding to the outermost portion when the actuator 111 is rolled.

Next, in Mode B, the first switch sw1 maintains the turn-on state, the second switch sw2 is turned on, and the third and fourth switches sw3 and sw4 maintain the turn-on state.

As a result, the power supplied to the power supply unit 150 is selectively applied to the first and second areas A and B of the second member 1133 through the first and second switches sw1 and sw2. Therefore, the heat is additionally generated even in the second area B in addition to the first area A of the second member 1133, and the second area B is also transformed to the unrolled shape which is the sequentially stored shape subsequently to the first area A. Accordingly, in Mode B, the display unit 110 may be further unrolled than the display unit 110 in Mode A.

Next, in Mode C, the first and second switches sw1 and sw2 maintain the turn-on state, the third switch sw3 is additionally turned on, and the fourth switch sw4 maintains the turn-on state.

As a result, the power supplied to the power supply unit 150 is selectively applied to the first to third areas A, B, and C of the second member 1133 through the first to third switches sw1 to sw3. Therefore, the heat is additionally generated even in the third area C in addition to the first and second areas A and B of the second member 1133, and the third area C is also transformed to the unrolled shape which is the sequentially stored shape subsequently to the third area C. Accordingly, in Mode C, the display unit 110 may be further unrolled than the display unit 110 in Mode B.

Next, in Mode D, the first to third switches sw1 to sw3 maintain the turn-on state, the fourth switch sw4 is additionally turned on, and the fourth switch sw4 maintains the turn-on state.

As a result, the power supplied to the power supply unit 150 is selectively applied to all areas A, B, C, and D of the second member 1133 through the first to fourth switches sw1 to sw4. Therefore, the heat is additionally generated even in the fourth area D in addition to the first to third areas A, B, and C of the second member 1133, and the fourth area D is also transformed to the unrolled shape which is the sequentially stored shape subsequently to the first to third areas A, B, and C. Accordingly, in Mode D, the display unit 110 may be fully unrolled.

On the contrary, when the display unit 11 is transformed from the unrolled state to the rolled state, the transformation is performed in a reverse order to the above-described unrolling operation, and as a result, a detailed description will be omitted.

As described above, the display device 100 according to an embodiment may be self-rolled or rolled by the electric signal without a help of any machine device, and furthermore, a degree in which the display device 100 is unrolled or rolled may be adjusted stepwise.

In the above description, an example in which the actuator 113 operates by the applied electric signal stepwise is described. In another example, the display unit 110 may also be configured to include n actuators having different lengths.

In an example of FIG. 23, the actuator 113 may be configured to include a first actuator 113*a* and a second actuator 113*b*. The first actuator 113*a* has a first length h1 and the second actuator 113*b* has a second length h2 shorter than the first length.

The first actuator 113*a* and the second actuator 113*b* may be constituted by a plurality of numbers of the same number.

In an example, the first actuator 113*a* may have the length h1 which is substantially the same as the second-direction length of the display unit 110 and the length h2 of the second actuator 113*b* may be ½ of the first length h1.

In the first direction, the first actuator 113*a* and the second actuator 113*b* may be alternately disposed, and an interval between the first actuator 113*a* and the second actuator 113*b* may be equal.

When the actuator is configured as such, a configuration of the switching unit 130 controlling this may be illustrated in FIG. 24. FIG. 24 is a diagram illustrating a switch configuration of the switching unit that supplies the power to the actuator illustrated in FIG. 23.

Referring to FIG. 24, the switching unit 130 may include the first and second switches sw1 and sw2. The first switch sw1 is commonly connected to a plurality of first actuators 113*a* and the second switch sw2 is commonly connected to a plurality of second actuators 113*b*.

When the switching unit 130 intends to unroll the entirety of the display unit 120, the first switch sw1 is turned on and the second switch sw2 is turned off. As a result, the power may be supplied all of the plurality of first actuators 130*a* and not supplied to the second actuator 130*b*. As a result, the display unit 110 may be fully unrolled.

Alternatively, the switching unit 130 may turn off the first switch sw1 and turn on only the second switch sw2. As a result, since the power is applied only to the second actuator 130*b*, ½ of the display unit 110 is unrolled and the remaining ½ maintains the rolled shape.

As such, the display unit 130 also configures the length of the actuator differently to adjust the size of the screen stepwise.

The embodiments of the present disclosure described above are not mutually exclusive or distinct from each other. Respective components or functions of the embodiments of the present disclosure described above may be jointly used or combined with each other.

In the above-described diagrams, a structure of the display device in which the display unit is rolled up from the inside of the housing is illustrated, but the present disclosure is not limited thereto, and the above-described diagrams may be applied even to a structure of the display device in which the display unit is rolled down from the inside of the housing.

The aforementioned detailed description should not be construed as restrictive in all terms and should be exemplarily considered. The scope of the present disclosure should be determined by rational construing of the appended claims and all modifications within an equivalent scope of the present disclosure are included in the scope of the present disclosure.

The invention claimed is:

1. A self-transformable actuator comprising:
a first member having a shape which is transformable from a first position to a second position different from the first position, the first member being configured to store restoration force based on the shape being transformed from the first position to the second position, wherein the first position is in one of a rolled state or an unrolled state; and
a second member bonded to the first member in a longitudinal direction of the first member, and configured to store the shape of the second position,
wherein the first member is configured to maintain the first position when no heat is applied to the second member, transform the shape from the first position to the second position when heat is applied to the second member, and store the restoration force to restore to the first position when the shape is transformed to the second position, and
wherein the second member is configured to transform from the first position to the second position when heat is applied to the second member, and change shape from the second position to the first position when the restoration force is applied to the second member by the first member.

2. The self-transformable actuator of claim 1, wherein the first member is an elastic body and the second member is a shape memory alloy.

3. The self-transformable actuator of claim 1, wherein the first member and the second member have a rolled shape at the first position.

4. The self-transformable actuator of claim 1, further comprising:
a trigger disposed on one end of the first member and configured to store a shape opposite to the shape stored by the second member.

5. The self-transformable actuator of claim 1, wherein the second member is disposed in a groove disposed at an area of the first member.

6. The self-transformable actuator of claim 1, further comprising a stopper which maintains the second position of the second member.

7. The self-transformable actuator of claim 6, wherein the stopper includes a part of the first member, and has a length which is equal to a length of the first member in the longitudinal direction of the first member.

8. The self-transformable actuator of claim 6, wherein the stopper allows at least a part of a cross section of the first member to be projected in a rounded state at the second position, and the cross section of the first member to act to be flat at the first position.

9. The self-transformable actuator of claim 1, further comprising a stopper located between portions of the first member.

10. The self-transformable actuator of claim 9, wherein, in a first state, a top surface of the stopper forms a flat surface with a top surface of the first member.

11. The self-transformable actuator of claim 10, wherein, in a second state, the stopper includes a curved shape and has a portion located above the top surface of the first member.

12. The self-transformable actuator of claim 11, wherein, in the second state, the top surface of the stopper is entirely located above the top surface of the first member.

13. The self-transformable actuator of claim 11, wherein, in the second state, a portion of the second member is located above the top surface of the first member.

14. The self-transformable actuator of claim 1, wherein the second member is formed in a cylindrical shape extending in the longitudinal direction of the first member.

15. The self-transformable actuator of claim 14, wherein a width in a horizontal direction of the first member is greater than a width of the second member in the horizontal direction.

16. The self-transformable actuator of claim 1, wherein the second member is located at a central portion of the self-transformable actuator.

\* \* \* \* \*